United States Patent
Persson

[11] Patent Number: 6,075,208
[45] Date of Patent: Jun. 13, 2000

[54] COMPONENT MOUNTING ARRANGEMENT AND ASSEMBLY

[75] Inventor: Michael Persson, Tullinge, Sweden

[73] Assignee: Telefonaktiebolaget L M Ericsson (publ), Stockholm, Sweden

[21] Appl. No.: 09/212,428

[22] Filed: Dec. 16, 1998

[30] Foreign Application Priority Data

Dec. 17, 1997 [SE] Sweden .................................. 9704719

[51] Int. Cl.⁷ ..................................................... H01R 4/48
[52] U.S. Cl. ........................ 174/52.1; 174/16.3; 257/718; 361/704; 361/807
[58] Field of Search ................................ 174/52.1, 16.3; 361/807, 704, 719; 257/718

[56] References Cited

U.S. PATENT DOCUMENTS

| | | | |
|---|---|---|---|
| 5,138,524 | 8/1992 | Smithers | 361/386 |
| 5,870,287 | 2/1999 | Rodriguez et al. | 361/704 |

FOREIGN PATENT DOCUMENTS 07259140   4/1997   Japan.

OTHER PUBLICATIONS

IBM Technical Disclosure Bulletin, vol. 24, No. 1A, Jun. 1981, M. Lovatt, p. 226.

*Primary Examiner*—Kristine Kincaid
*Assistant Examiner*—W. David Walkenhorst

[57] ABSTRACT

Heat-generating power transistors (3) hanging from a circuit board (2) are mounted pressed flush against the inside surface of a heat dissipating thin sheet metal box (1), by using spring metal band clips (4) completely mountable from outside the metal box (1), by insertion of a foot end (4b) of each clip into a first slot (6) in the box and snapping an opposite end (4a), bent to form a spring fluke, into a second parallel slot (5). Slots (6,5) and a clip recessing trough (7) between them can be stamped in the thin sheet metal box bottom (1b).

7 Claims, 7 Drawing Sheets

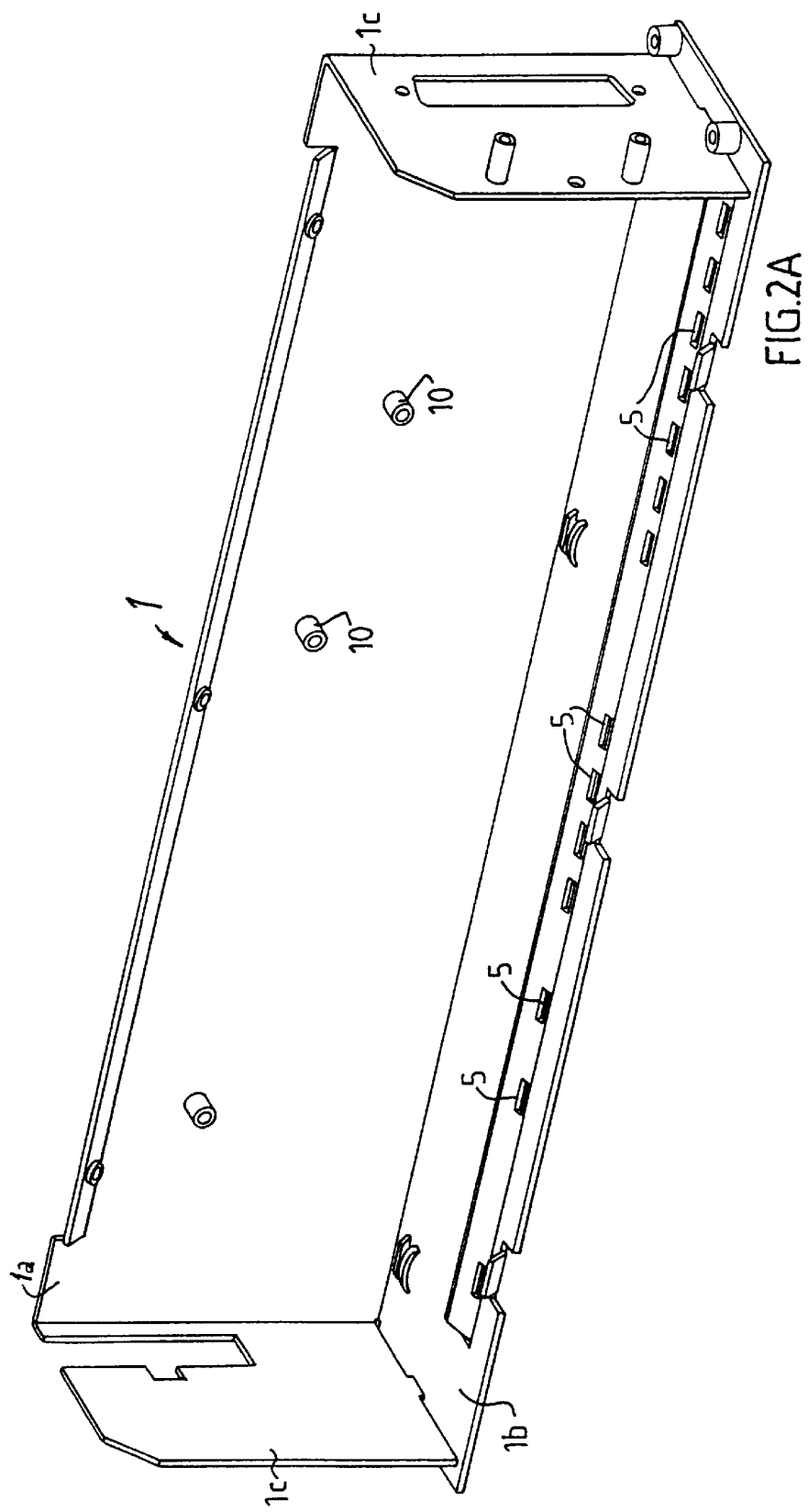

COMPONENT MOUNTING ARRANGEMENT AND ASSEMBLY

TECHNICAL FIELD OF THE INVENTION

The present invention relates to an arrangement for mounting a component or components and to an assembly. The invention relates to novel means for mounting heat-producing electrical components, such is power transistors for example, in heat transmitting flush abutment against a heat dissipating metal mounting plate.

DESCRIPTION OF RELATED ART

The present invention addresses problems arising when mounting heat generating electronic components. When mounting circuit boards in electronic power units, the power transistors are connected hanging from the board since they generate excessive amounts of heat and must be cooled in some way. Spring clips have been used to mount these heat generating power transistors surface-to-surface (flush), with as much surface contact as possible, against a mounting plate or box, to which the heat is transferred. Either a thin sheet metal mounting plate/box or a thick cast-metal mounting base is used. In the former case, the thin sheet metal mounting plate/box conducts the heat rapidly away, preferably to a heat absorbing and dissipating chassis on which it is flush-mounted. In the latter case, the thick cast-metal mounting base acts as a heat sink which has more capacity to absorb heat, but does not conduct the heat away as rapidly as does the thin sheet metal box.

Various forms of spring clips have been used to hold the appended power transistors pressed surface-to-surface (flush) against the surface of the mounting box or mounting base. Examples of such previously known clips are described in U.S. Pat. No. 5,373,099, DE-A 42 18 224, U.S. Pat. No. 5,343,362, and IBM Technical Disclosure Bulletin, Vol. 24, No. 1A, June 1981, page 226. These spring clips and mounting boxes/bases have all been designed for mounting a component, such as a transistor, against a side of a mounting base or plate from the component-side of the base and when this mounting base or plate is the inside of a box, then the assembly worker must maneuver his or her fingers inside the box, which is often very difficult due to the different components within the box. The same problems arise when the spring clips are to be removed.

A known method of mounting a row of spring clips is to place a bar over the ends of all the spring clips remote from the power transistors, and hold this bar in place using screws screwed in through the bottom of the box. This has the disadvantage of having to manually hold all the springs and the bar in place while the screws are screwed in. Using screws, it is difficult, when using the thin sheet metal box favored for conducting heat rapidly away from the power transistors, to prevent the screw heads from protruding beyond the surface of the outside bottom of the box. Protruding screw heads prevent the sheet metal box from being mounted flush against the heat absorbing chassis.

The use of known spring clips with spring "flukes" or snap hooks at one or both ends is described inter alia in the above mentioned IBM Technical Disclosure Bulletin Vol. 24, No. 1A, June 1981, page 226, which describes a two-legged, saddle-shaped mounting spring clip which straddles and firmly fixes a transistor against a mounting board by inserting the hooked ends of the two legs, one end being folded over to form a spring fluke, into slots on either side of the transistors. These clips give rise to the same problems as the protruding screw heads since the hook ends of the spring clip protrude above the surface of the outside bottom of the sheet metal box (in addition to the difficulties involved with mounting from the inside as described above).

SUMMARY OF THE INVENTION

These and other disadvantages of the prior art devices and arrangements are removed by an arrangement and an assembly, respectively, of the types described in the preambles to claims 1 and 9 respectively, which have the characterizing features recited in claims 1 and 9 respectively.

The arrangement and assembly according to the present invention permit easily manufactured steel band spring clips to be mounted in place and be removed without having to enter the box at all. This provides for easier manual assembly or robotized assembly.

It is also possible to easily stamp the mounting plate of relatively thin sheet metal with a trough and slots for the spring clips. This permits the assembled box, clips and circuit board with appended transistors to be mounted flush against a heat absorbing chassis.

BRIEF DESCRIPTION OF THE DRAWINGS

FIG. 2a shows the mounting box alone.

DETAILED DESCRIPTION OF EMBODIMENTS

FIG. 1 shows one embodiment of a spring clip 4 for use in an arrangement and assembly according to the present invention made of spring steel and having an arch 4c ending in a foot 4b with a planar undersurface intended to press the heat-generating electronic component against the surface of the box. The other end of the spring clip is provided with a V-spring fluke end 4a.

Figure 1A:
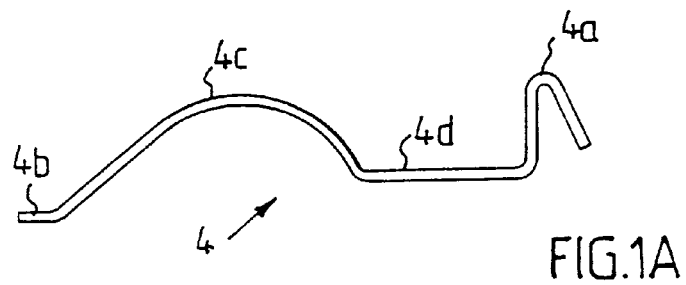
FIGS. 1A and 1B show a side elevation and a plan view respectively of a clip used in the arrangement and assembly according to the invention.
Figure 1B:
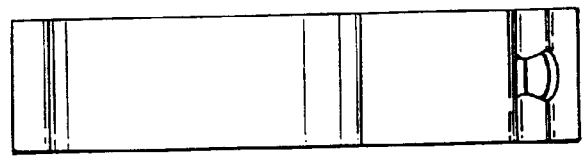
Figure 1C:
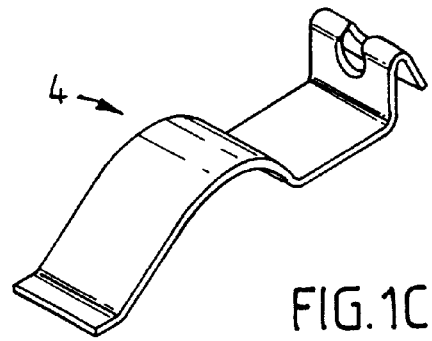
FIGS. 1C and 1D show two different perspective views of the aforementioned spring clip.
Figure 1D:
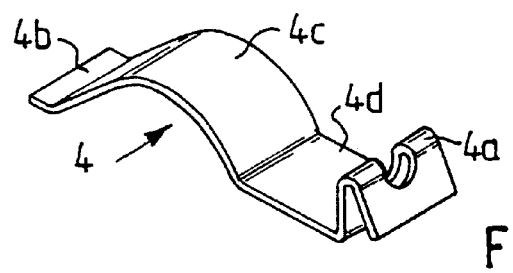
Figure 2B:
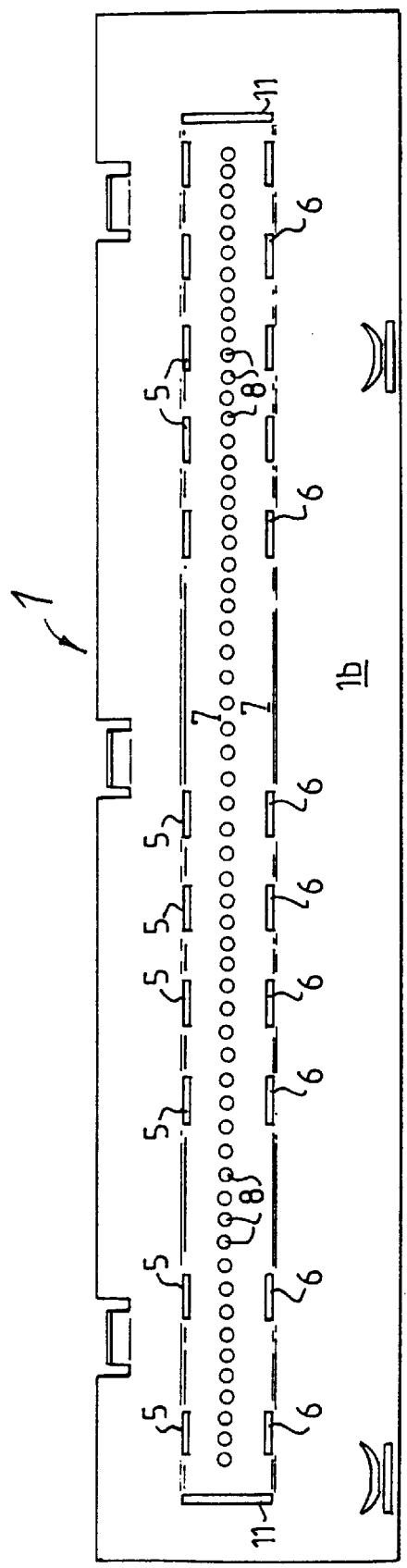
FIG. 2b shows the mounting box 1 as seen from below.
Figure 2C:
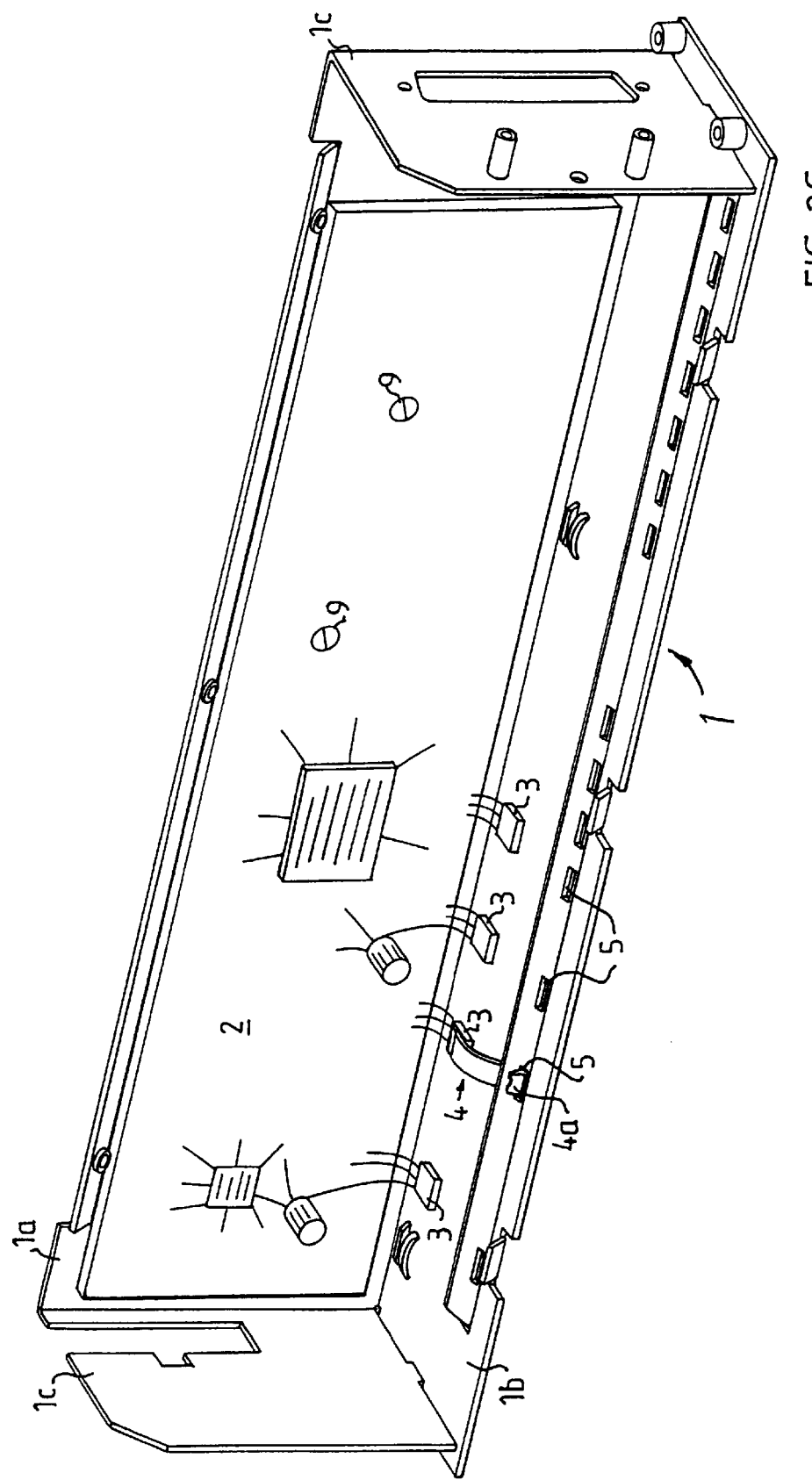
FIG. 2c shows the assembly according to the invention comprising the mounting box 1 provided with spring clips 4 (only one shown), pressing power transistors 3 in place flush against the bottom portion 1b of the mounting box 1. The power transistors 3 hang down from a circuit board.

As can be seen in FIGS. 2a–c, the mounting box 1 is made from a piece of sheet metal folded to form a back 1a, a bottom 1b and two end pieces 1c. The back 1a is designed to receive a pre-manufactured circuit board 2 which is held in place by screws 9 screwed into threaded pedestals 10 in the back 1a.

As best can be seen in FIG. 2b (see also FIGS. 2a–b as well as FIGS. 3A–C), the bottom 1b is provided with a trough 7 (forming a ridge on the inside of the box). Slots 5, 6 are arranged on either side of the trough. The trough is created by first stamping out the sides slots 5,6 and two end slots 11 as well as a row of holes 8 along the line where the bottom of the trough is to be. The slots and holes weaken the sheet metal at the right places for a proper trough to be formed when an elongated edge tool is pressed down along the row of holes 8.

Figure 3A:
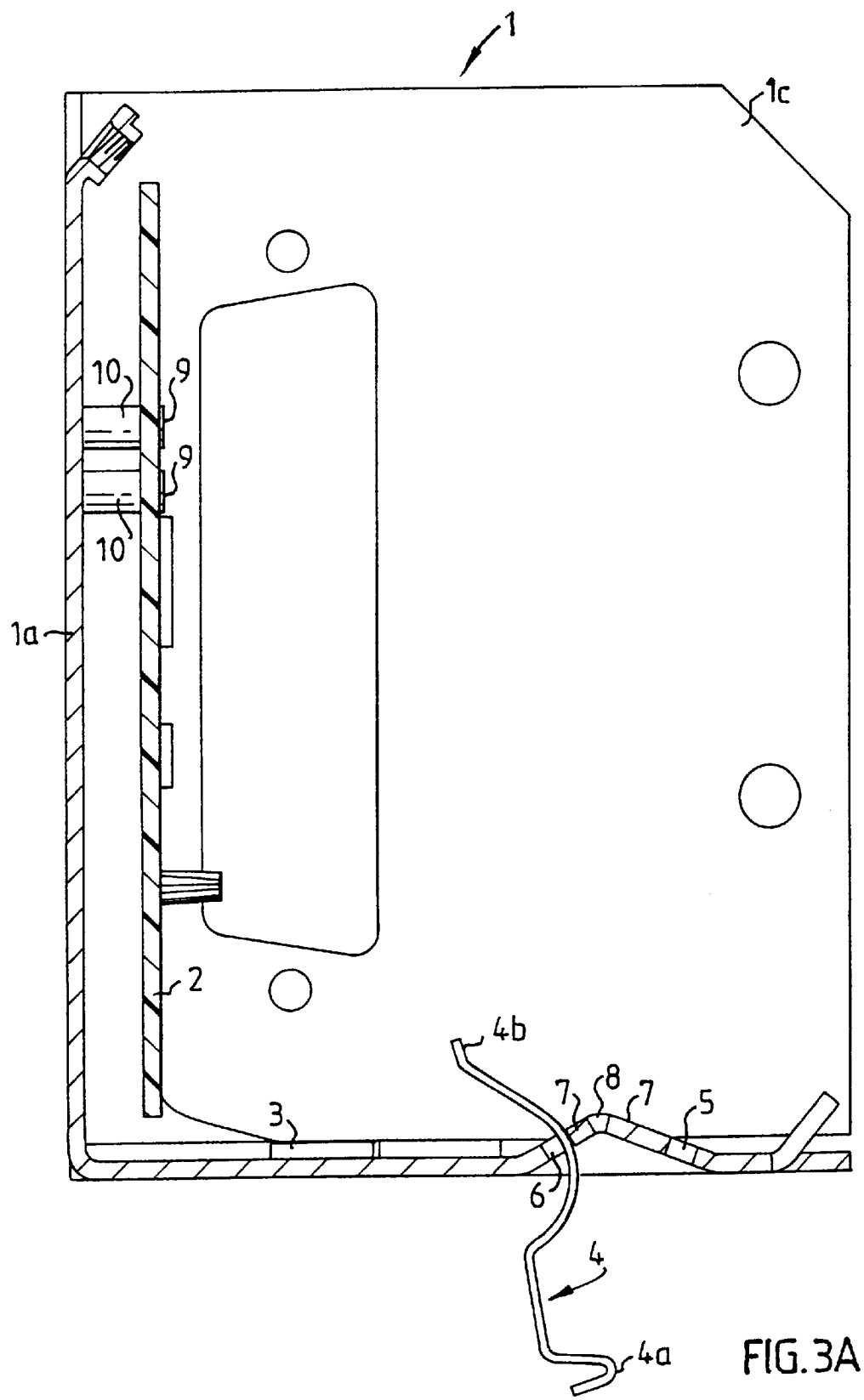
FIGS. 3A–C show how the spring clip is inserted and snapped into place to press the power transistor flush against the heat dissipating mounting box 1.
Figure 3B:
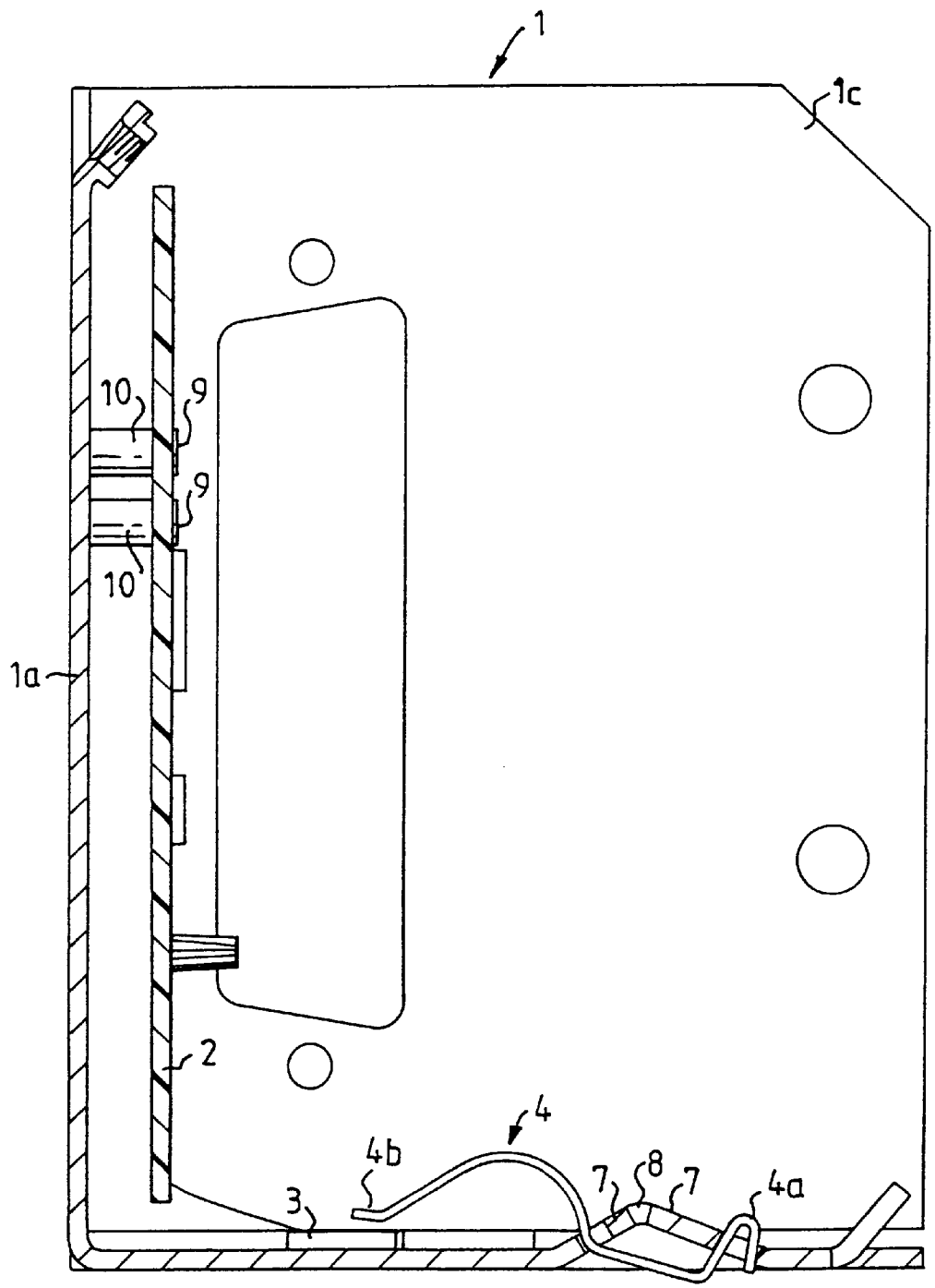
Figure 3C:
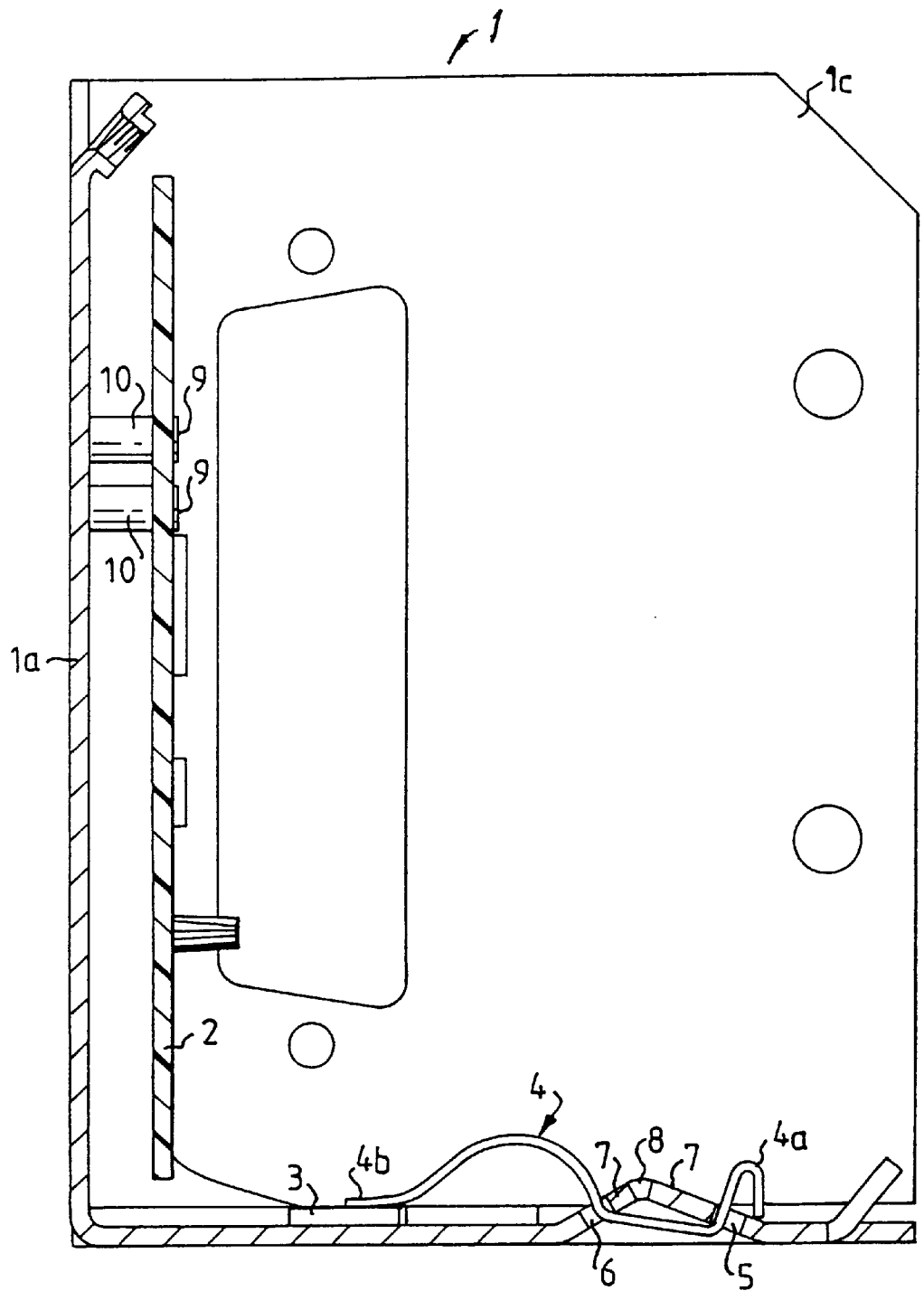

Each of a series of spring clips 4 is inserted as shown sequentially in FIGS. 3A–C. The foot 4b of the spring clip is inserted through the slot 6 closest to the transistor 3. The clip is then pivoted as shown in FIG. 3B so that the foot 4b comes to rest on the transistor 3 and the V-spring fluke end 4a is inserted into the slot 5 remote from the transistor. Pressure is applied until the fluke snaps out to lock the spring clip in place, as shown in FIG. 3C. The spring clip is held securely in place and each spring clip can be removed by compressing the V-spring fluke end 4a.

The person skilled in the art will readily recognize other means for fixing the spring clip in place, such as a merely inserting an outwardly or inwardly bent hook end of the clip into slot 5, although these embodiments may not be as secure.

This spring clip and the arrangement of which it is a part, thus provide an easy method of pressing the power transistor surface-to-surface against the heat transmitting thin sheet metal box. The spring clips can be mounted entirely from the outside using robots, and, when mounted in place, the spring clips do not protrude beyond the surface of the box, thereby making it easy to mount the box surface-to-surface against a heat absorbing chassis. The trough with slots is also very easy to stamp in the thin sheet metal.

What is claimed is:

1. Arrangement comprising:
   (a) a mounting element (1) having a first side and a second side;
   (b) a component to be mounted on the surface of the first side of the mounting element;
   (c) a spring clip, having a first end (4b) and a second end (4a), and being disposed for mounting the component continually pressed by spring force against the first side of the mounting element; wherein,
      the mounting element (1) is provided with at least one first slot (6) and at least one second slot (5);
      the spring clip is insertable with said first end (4b) into said first slot (6) in the mounting element from the second side of the mounting element opposite the component, until the component is sandwiched between the mounting element (1) and said first end (4b);
      a second opposite end (4a) of the spring clip is provided with hook means (4a) for engagement in the second slot (5) from said second side, whereupon the spring force of the spring clip continually presses the component against the surface of the first side of the mounting element; and
      said second side of the mounting element (1) is provided with a depression intermediate said first and second slots (5,6), such that the spring clip, when mounted in place, does not extend above the surface of said second side adjacent said depression.

2. Arrangement according to claim 1, wherein portion (4d) of the spring clip (4) exposed on said second side of the mounting element (1), when mounted in place, is completely contained within the depression.

3. Arrangement according to claim 2, wherein a plurality of first slots (6) are arranged in a first line and a plurality of second slots (5) are arranged in a second line parallel thereto.

4. Arrangement according to claim 3, wherein depressions between the first and second slots (6,5) form a continuous trough (7) between the first and second lines of slots.

5. Assembly comprising an arrangement as recited in one of claims 1–4, wherein heat generating components are appended to an electrical circuit board (2), also mounted on the mounting element (1).

6. Assembly according to claim 5, wherein said heat generating components are transistor units (3).

7. Assembly according to claim 5, wherein said mounting element (1) is in turn intended for mounting flush against a heat absorbing chassis.

* * * * *